US012652841B2

(12) United States Patent
Wang et al.

(10) Patent No.: US 12,652,841 B2
(45) Date of Patent: Jun. 9, 2026

(54) EPITAXIAL STRUCTURE WITH INCREASED ELECTROSTATIC DISCHARGE PROTECTION CAPABILITY CONTAINING AlGaInP LAYERS

(71) Applicant: PlayNitride Display Co., Ltd., MiaoLi County (TW)

(72) Inventors: Shen-Jie Wang, MiaoLi County (TW); Hsin-Chiao Fang, MiaoLi County (TW); Yen-Lin Lai, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 655 days.

(21) Appl. No.: 18/317,944

(22) Filed: May 16, 2023

(65) Prior Publication Data

US 2024/0339505 A1 Oct. 10, 2024

(30) Foreign Application Priority Data

Apr. 7, 2023 (TW) ................................. 112113021

(51) Int. Cl.
*H10D 62/824* (2025.01)

(52) U.S. Cl.
CPC .................................. *H10D 62/824* (2025.01)

(58) Field of Classification Search
CPC .............................. H10D 62/824; H10D 62/85
See application file for complete search history.

(56) References Cited

U.S. PATENT DOCUMENTS

2020/0295221 A1* 9/2020 Suarez .............. H10F 77/12485
2022/0367751 A1 11/2022 Tonkikh et al.

FOREIGN PATENT DOCUMENTS

TW 201613146 4/2016
TW 202105760 2/2021
WO WO-2024179842 A1* 9/2024 ........... H10H 20/815

OTHER PUBLICATIONS

"Office Action of Taiwan Counterpart Application", issued on Jul. 10, 2024, p. 1-p. 3.

* cited by examiner

*Primary Examiner* — Davienne N Monbleau
*Assistant Examiner* — Dmitri Mihaliov
(74) *Attorney, Agent, or Firm* — JCIPRNET

(57) ABSTRACT

An epitaxial structure includes a first type semiconductor layer, an active layer, a second type semiconductor layer, and a lattice mismatch layer. The first type semiconductor layer includes a material of aluminum gallium indium phosphide. The active layer is disposed on a side of the first type semiconductor layer. The second semiconductor layer is disposed on a side of the active layer away from the first type semiconductor layer, and includes the material of aluminum gallium indium phosphide. The lattice mismatch layer includes the material of aluminum gallium indium phosphide and is disposed on any side of the first type semiconductor layer, the active layer, or the second type semiconductor layer. In an X-ray diffractometer analysis spectrum, at least one of the first type semiconductor layer, the active layer and the second type semiconductor layer corresponds to a main diffractive peak, the lattice mismatch layer has a secondary diffractive peak.

13 Claims, 11 Drawing Sheets

100

— 180
— 160
— 130
— 140
— 130
— 120
— 110
— 170

100b

— 160
— 130
— 140
— 130
— 120
— 110
— 190
— 180

170

100c

100d

100e

100f

100h

100i

100j

160

130

120

110

140

100k

100I

100m

100n

EPITAXIAL STRUCTURE WITH INCREASED ELECTROSTATIC DISCHARGE PROTECTION CAPABILITY CONTAINING AlGaInP LAYERS

CROSS-REFERENCE TO RELATED APPLICATION

This application claims the priority benefit of Taiwan application serial no. 112113021, filed on Apr. 7, 2023. The entirety of the above-mentioned patent application is hereby incorporated by reference herein and made a part of this specification.

BACKGROUND

Technical Field

The invention relates to a semiconductor structure, and more particularly, to an epitaxial structure.

Description of Related Art

Semiconductor epitaxial structures may be applied in many fields, such as integrated circuit chips, light emitting diodes, laser diodes, photodiodes, transistors, etc. The semiconductor epitaxial structures in many fields have penetrated into daily life of human beings, providing many of the needs of human life and works.

However, the semiconductor epitaxial structure may be affected by electrostatic discharge (ESD) phenomena due to various reasons, and a path of electrostatic discharge is likely to burn or damage the semiconductor epitaxial structure.

Regarding a conventional red light micro light-emitting diode (micro-LED) using a quaternary semiconductor material (such as aluminum gallium indium phosphide), electrostatic discharge protection capability of a P-type semiconductor layer and an N-type semiconductor layer thereof needs to be improved.

SUMMARY

The invention provides an epitaxial structure with good electrostatic discharge protection capability.

An embodiment of the invention provides an epitaxial structure including a first type semiconductor layer, an active layer, a second type semiconductor layer, and a lattice mismatch layer. The first type semiconductor layer includes a material of aluminum gallium indium phosphide. The active layer is disposed on a side of the first type semiconductor layer. The second semiconductor layer is disposed on a side of the active layer away from the first type semiconductor layer, and includes the material of aluminum gallium indium phosphide. The lattice mismatch layer includes the material of aluminum gallium indium phosphide and is disposed on any side of the first type semiconductor layer, the active layer, or the second type semiconductor layer. In an X-ray diffractometer analysis spectrum, at least one of the first type semiconductor layer, the active layer, and the second type semiconductor layer corresponds to a main diffractive peak, and the lattice mismatch layer has a secondary diffractive peak. A difference between diffractive angles of the secondary diffractive peak and the main diffractive peak falls within a range of 400 arc-seconds to 900 arc-seconds.

In the epitaxial structure of the embodiment of the invention, the lattice mismatch layer is added, and a lattice arrangement thereof is relatively disordered compared with the adjacent semiconductor layer, and the lattice does not match the adjacent semiconductor layer. Through the disorder or mismatch of lattice arrangement, a current distribution path may be changed, which may increase the ability to resist electrostatic discharge breakdown. Therefore, the epitaxial structure of the embodiment of the invention has good electrostatic discharge protection capability.

DESCRIPTION OF THE EMBODIMENTS

Figure 1:
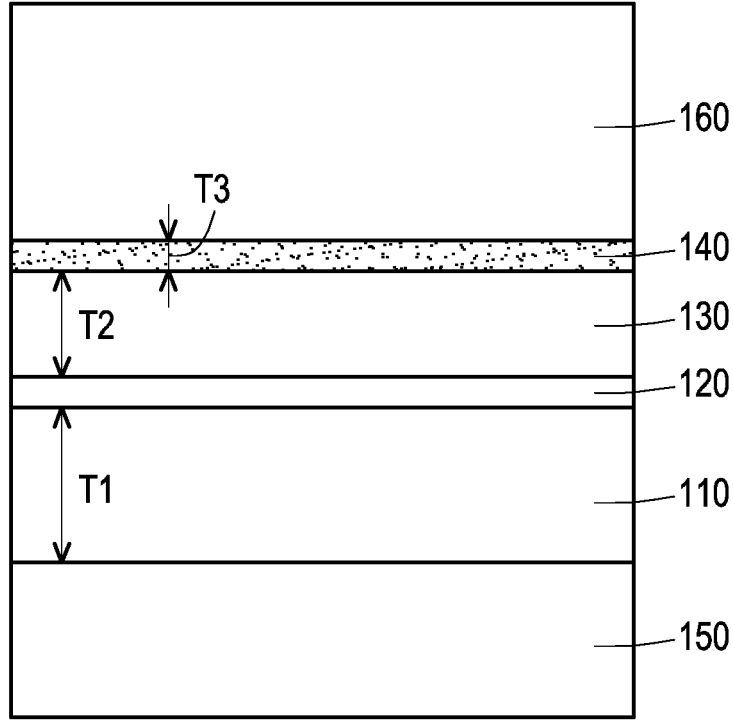
FIG. 1 is a schematic cross-sectional view of an epitaxial structure according to an embodiment of the invention.
Figure 2A:
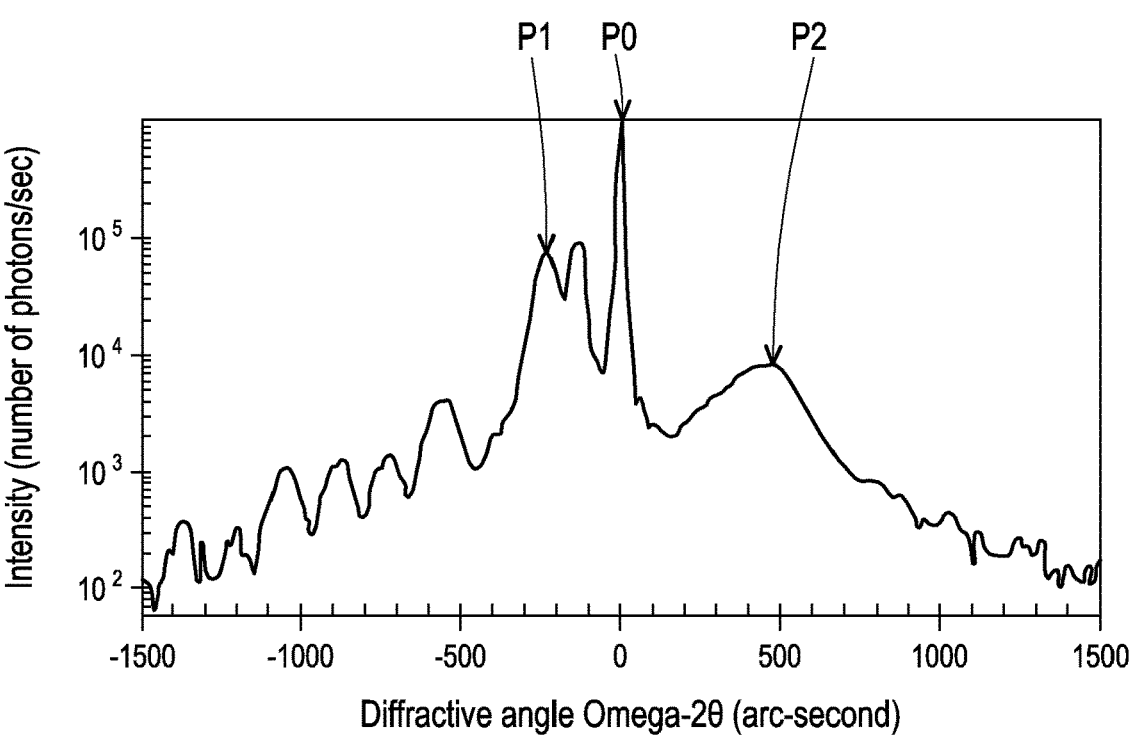
FIG. 2A is an X-ray diffractometer analysis spectrum of the epitaxial structure of FIG. 1.

FIG. 1 is a schematic cross-sectional view of an epitaxial structure according to an embodiment of the invention, and FIG. 2A is an X-ray diffractometer analysis spectrum of the epitaxial structure of FIG. 1. Referring to FIG. 1 and FIG. 2A, an epitaxial structure 100 of the embodiment includes a first type semiconductor layer 110, an active layer 120, a second type semiconductor layer 130 and a lattice mismatch layer 140. The first type semiconductor layer 110 includes a material of aluminum gallium indium phosphide (AlGaInP). In the embodiment, the first type semiconductor layer 110 is, for example, an N-type semiconductor layer. The active layer 120 is disposed on one side of the first type semiconductor layer 110. In the embodiment, the active layer 120 is, for example, a quantum well layer or multiple quantum well layers.

The second type semiconductor layer 130 is disposed on a side of the active layer 120 away from the first type semiconductor layer 110, and includes the material of AlGaInP. In the embodiment, the second type semiconductor layer 130 is, for example, a P-type semiconductor layer. However, in other embodiments, the first type semiconductor layer 110 may also be a P-type semiconductor layer, and the second type semiconductor layer 130 may be an N-type semiconductor layer.

The lattice mismatch layer 140 comprises the material of AlGaInP, and is disposed on any side of the first type semiconductor layer 110, the active layer 120 or the second type semiconductor layer 130, and in the embodiment of FIG. 1, the lattice mismatch layer 140 is, for example, disposed on the side of the second type semiconductor layer 130 away from the active layer 120.

In the X-ray diffractometer analysis spectrum of the epitaxial structure 100 (as shown in FIG. 2A), at least one of the first type semiconductor layer 110, the active layer 120 and the second type semiconductor layer 130 corresponds to a main diffractive peak P1, the lattice mismatch layer 140 has a secondary diffractive peak P2. Here, a horizontal axis represents positions of light diffractive angles Omega-2θ of the epitaxial structure 100 under the X-ray diffractometer, and a vertical axis represents the number of photons measured per unit time corresponding to each diffractive angle Omega-2θ. In FIG. 2A, the X-ray diffractometer detects higher intensities (the number of photons) at different diffractive angles Omega-2θ, and may interpret that the main diffractive peak P1 and the secondary diffractive peak P2 are respectively from the first type semiconductor layer 110 and/or the second type semiconductor layer 130 and the lattice mismatch layer 140 of the epitaxial structure 100, and a difference of the diffractive angles Omega-2θ between the secondary diffractive peak P2 and the main diffractive peak P1 falls within a range of 400 arc-seconds to 900 arc-seconds. Existence of the difference indicates that a lattice constant of the lattice mismatch layer 140 does not match lattice constants of the first type semiconductor layer 110 and the second type semiconductor layer 130.

Figure 2B:
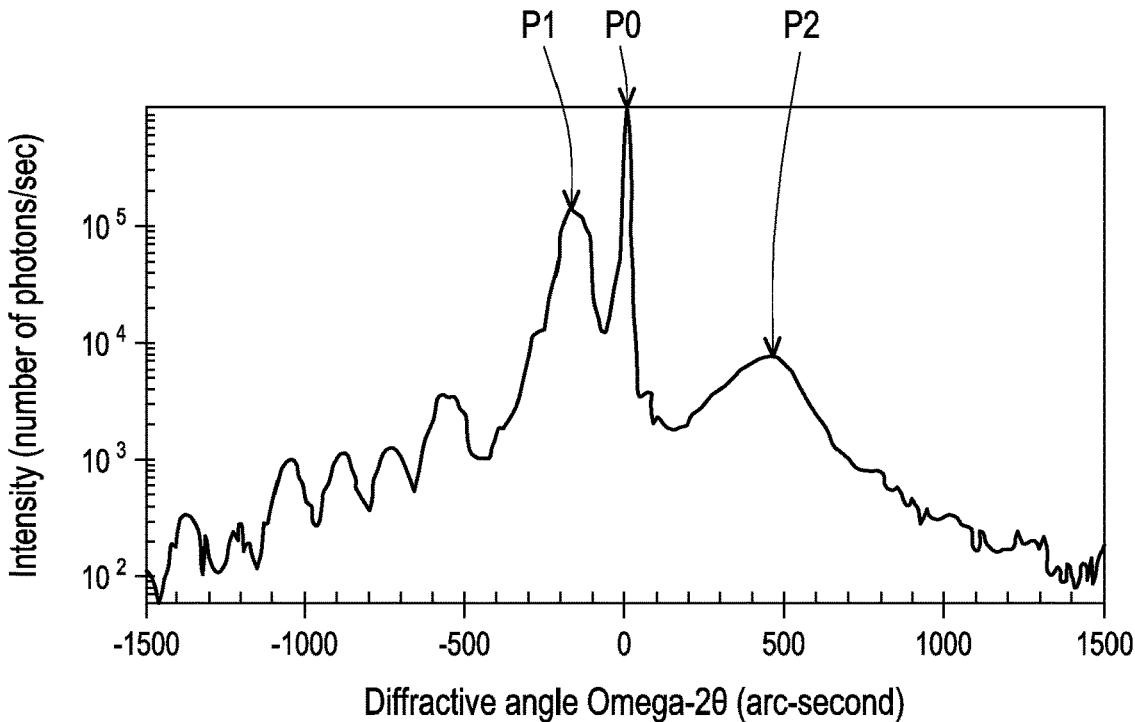
FIG. 2B is an X-ray diffractometer analysis spectrum of the epitaxial structure of FIG. 1 according to another embodiment.
Figure 3:
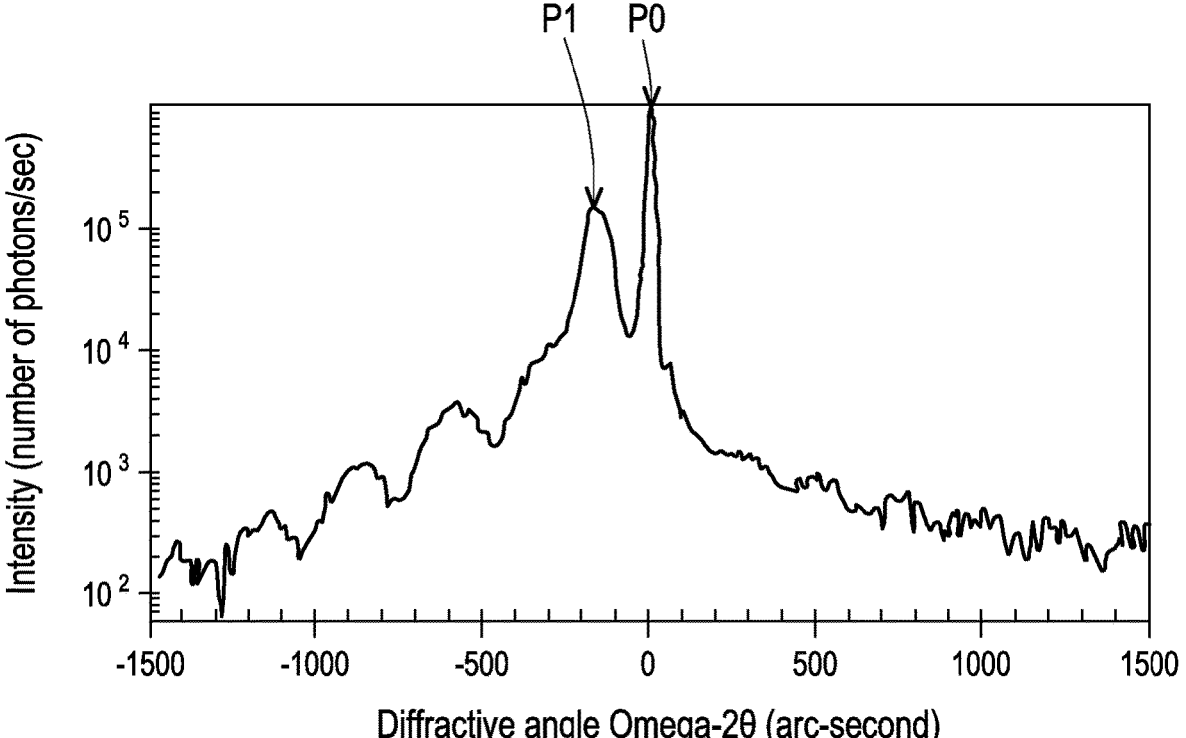
FIG. 3 is an X-ray diffractometer analysis spectrum of the epitaxial structure of FIG. 1 without disposing a lattice mismatch layer.

FIG. 2B is an X-ray diffractometer analysis spectrum of the epitaxial structure of FIG. 1 according to another embodiment, and FIG. 3 is an X-ray diffractometer analysis spectrum of the epitaxial structure of FIG. 1 without disposing the lattice mismatch layer 140. Referring to FIG. 1, FIG. 2B and FIG. 3, it may be seen from FIG. 2B that the main diffractive peak P1 and the secondary diffractive peak P2 are respectively located on the left and right sides of a reference diffractive peak P0. Referring to FIG. 2A and FIG. 2B again, in FIG. 2A, there is another peak between the main diffractive peak P1 and the reference diffractive peak P0, while in FIG. 2B, there is only the single main diffractive peak P1, which represents that under the state of FIG. 2B, a lattice composition in the first type semiconductor layer 110 and/or the second type semiconductor layer 130 has a higher consistency. In FIG. 3, since the lattice mismatch layer 140 is not provided, there is no secondary diffractive peak P2 in the X-ray diffractometer analysis spectrum of FIG. 3.

In the embodiment, a full width at half maximum of the secondary diffractive peak P2 falls within a range of 150 arc-seconds to 400 arc-seconds, i.e., the secondary diffractive peak P2 is a relatively wide peak, and this means that the lattice in the lattice mismatch layer 140 is not only mismatched with the lattices of the first type semiconductor layer 110 and the second type semiconductor layer 130, but also its own lattice arrangement is relatively disordered. In one embodiment, the full width at half maximum of the secondary diffractive peak P2 is 300 arc-seconds.

In addition, in the X-ray diffractometer analysis spectrum of FIG. 2A or FIG. 2B, a ratio of the difference between the diffractive angles of the secondary diffractive peak P2 and the reference diffractive peak P0 to the full width at half maximum of the secondary diffractive peak P2 is between 1 and 2. For example, in FIG. 2A or FIG. 2B, it is assumed that the diffractive angle of the reference diffractive peak P0 is 0, and the diffractive angle of the secondary diffractive peak P2 is about 450 arc-seconds, so that the full width at half maximum of the secondary diffractive peak P2 may be between 225 arc-seconds and 450 arc-seconds. The meaning of the above ratio is that the larger the diffractive angle deviation of the secondary diffractive peak P2 relative to the reference diffractive peak P0 is, the greater the lattice constant difference between the lattice mismatch layer 140 and a growth substrate 150 is; and under such state, the lattice composition of the lattice mismatch layer 140 also tends to be more disordered, and its full width at half maximum is also enlarged along with this trend. Generally, the above ratio is about a variable between 1 and 2.

In the epitaxial structure 100 of the embodiment, the lattice mismatch layer 140 is added, the lattice arrangement thereof is disordered compared with the adjacent semiconductor layer, and the lattice does not match the adjacent semiconductor layer. Through the disorder or mismatch of lattice arrangement, a current distribution path may be changed, which may increase the ability to resist electrostatic discharge breakdown. Therefore, the epitaxial structure 100 of the embodiment of the invention has good electrostatic discharge protection capability.

In the embodiment, a diffractive intensity of the secondary diffractive peak P2 falls within a range of 5% to 20% of a diffractive intensity of the main diffractive peak P1. Here, the diffractive intensity (the number of photons) is approximately linearly proportional to a lattice number of the corresponding diffractive peak. Therefore, for example, in FIG. 1, when a thickness T3 of the lattice mismatch layer 140 increases, the diffractive intensity of the secondary diffractive peak P2 also increases. In an embodiment, the diffractive intensity of the secondary diffractive peak P2 is 10% of the diffractive intensity value of the main diffractive peak P1. For example, if the diffractive intensity of the secondary diffractive peak P2 is less than 5% of the diffractive intensity of the main diffractive peak P1, or the secondary diffractive peak P2 is too narrow (for example, the full width at half maximum thereof is less than 150 arc-seconds), it represents that the number of lattices whose lattice constants do not match the main diffractive peak P1 is too small, and the effect of changing the current distribution is insufficient. If the diffractive intensity of the secondary diffractive peak P2 is greater than 20% or the secondary diffractive peak P2 is too wide (for example, the full width at half maximum thereof is greater than 400 arc-seconds), the number of lattice mismatches is too large, indicating that the impurity components or the degree of misalignment in the epitaxial structure 100 may be too high, which may easily crack the epitaxial structure 100.

In the embodiment, the epitaxial structure 100 further includes a growth substrate 150, where the first type semiconductor layer 110 is disposed on the growth substrate 150. In the embodiment, a material of the growth substrate 150 is, for example, gallium arsenide (GaAs), but the invention is not limited thereto. The growth substrate 150 corresponds to the reference diffractive peak P0 in the X-ray diffractometer analysis spectrum (as shown in FIG. 2A), and the diffractive angle of the reference diffractive peak P0 is between the diffractive angles of the main diffractive peak P1 and the secondary diffractive peak P2. In the embodiment, the lattice constant of the lattice mismatch layer 140 is less than a lattice constant of the growth substrate 150. In the embodiment, the diffractive angle of the secondary diffractive peak P2 is greater than the diffractive angle of the reference diffractive peak P0. In the embodiment, the difference between the diffractive angles of the secondary diffractive peak P2 and the reference diffractive peak P0 falls within a range of 200 arc-seconds to 700 arc-seconds. In an embodiment, the difference between the diffractive angles of the secondary diffractive peak P2 and the reference diffractive peak P0 falls within a range of 450 arc-seconds to 500 arc-seconds, for example, the difference is 450 arc-seconds.

In the embodiment, a thickness T1 of the first type semiconductor layer 110 is greater than a thickness T2 of the second type semiconductor layer 130. The thickness T3 of the lattice mismatch layer 140 may fall within a range of 400 nm to 600 nm, which is, for example, 515 nm in an embodiment. In addition, In the embodiment, the epitaxial structure 100 further includes a window layer 160 disposed on the side of the second type semiconductor layer 130 away from the first type semiconductor layer 110, where the lattice mismatch layer 140 is disposed between the window layer 160 and the second type semiconductor layer 130, or inside one of the window layer 160 and the second type semiconductor layer 130, or disposed between the second type semiconductor layers 130 and the active layer 120, and in the embodiment of FIG. 1, the lattice mismatch layer 140 is, for example, disposed between the window layer 160 and the second type semiconductor layer 130. In the embodiment, a material of the window layer 160 is, for example, gallium phosphide (GaP), but the invention is not limited thereto.

Figure 4:
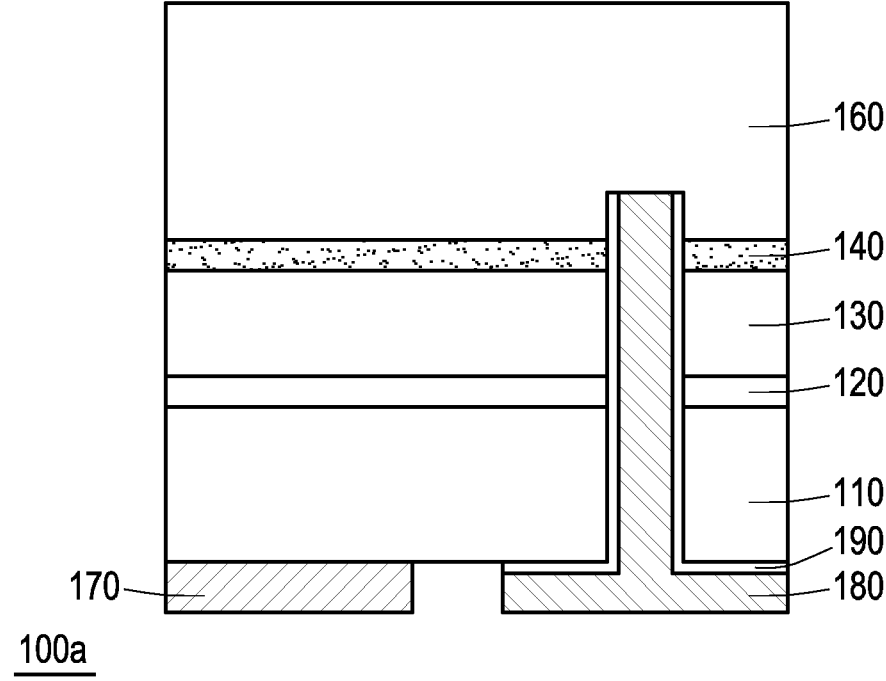
FIG. 4 is a schematic cross-sectional view of the epitaxial structure of FIG. 1 after removing a growth substrate and fabricating electrodes.

FIG. 4 is a schematic cross-sectional view of the epitaxial structure of FIG. 1 after removing the growth substrate and fabricating electrodes. Referring to FIG. 4, in the epitaxial structure 100a of the embodiment, the lattice mismatch layer 140 is disposed between the active layer 120 and the second type semiconductor layer 130. In addition, in the embodiment, the epitaxial structure 100a further includes a first electrode 170, a second electrode 180 and an insulating layer 190. The first electrode 170 is disposed on the first type semiconductor layer 110 and is electrically connected to the first type semiconductor layer 110. The second electrode 180 is disposed on the first type semiconductor layer 110 through the insulating layer 190, and is electrically connected to the window layer 160 through a conductive via, and the window layer 160 is electrically connected to the second type semiconductor layer 130, where the insulating layer 190 electrically insulates between the first type semiconductor layer 110 and the second electrode 180 and between the active layer 120 and the second electrode 180.

The lattice mismatch layer 140 may be disposed on a side of the first type semiconductor layer 110 or on a side of the second type semiconductor layer 130, and there are following advantages and characteristics to dispose the lattice mismatch layer 140 on the side of the second type semiconductor layer 130:

1. The window layer 160 is usually formed after the second type semiconductor layer 130 is formed, if the lattice mismatch layer 140 is formed on the side of the second type semiconductor layer 130, it is convenient to design the lattice mismatch layer 140 and the window layer 160 together to optimize an overall light output or adjust a current distribution.

2. As shown in FIG. 4, in a preferred embodiment, the lattice mismatch layer 140 is formed after the active layer 120 is formed, more preferably formed after the second type semiconductor layer 130 is formed, which may avoid the lattice mismatch layer 140 from affecting the epitaxial quality of the semiconductor layer.

3. Since current spreading requires a space, when the lattice mismatch layer 140 is located on one side of the second type semiconductor layer 130 and the window layer 160, a space of the window layer 160 may be used to distribute current.

4. In addition, from the perspective of a current path of the epitaxial structure 100, the more the lattice mismatch layer 140 is closer to the electrode, the better the current spreading effect is (for example, close to the second electrode 180 when being adjacent to the second type semiconductor layer 130). Since the thickness T1 of the first type semiconductor layer 110 is greater than the thickness T2 of the second type semiconductor layer 130, the thinner second type semiconductor layer 130 has less effect on the increase of the distance between the lattice mismatch layer 140 and the second electrode 180, which is beneficial for the lattice mismatch layer 140 to be close to the second electrode 180. Namely, in a growth stage of the epitaxial structure 100 shown in FIG. 1, the thicker first type semiconductor layer 110 is grown first, and the lattice mismatch layer 140 is formed later. In this way, regardless of whether the lattice mismatch layer 140 is located on any side of or inside the second type semiconductor layer 130 with the smaller thickness, a shorter distance between the lattice mismatch layer 140 and the second electrode 180 may be ensured.

In the embodiment, a proportion of indium atoms in the lattice mismatch layer 140 is less than a sum of proportions of aluminum and gallium atoms, and the proportion of indium atoms in the lattice mismatch layer 140 is also less than a proportion of indium atoms in at least one of the first type semiconductor 110, the active layer 120 and the second type semiconductor 130.

A chemical expression of the material of the lattice mismatch layer 140 is, for example, $Al_iGa_jIn_kP$, where $i+j+k=1$. For example, the chemical expressions of the materials of the lattice mismatch layer 140 in the three embodiments are respectively $Al_{0.3}Ga_{0.4}In_{0.3}P$, $Al_{0.55}Ga_{0.2}In_{0.25}P$ and $Al_{0.6}In_{0.4}P$ (when j=0). The chemical expression of the material of the second type semiconductor layer 130 is, for example, $Al_xGa_yIn_zP$, where $x+y+z=1$. For example, the chemical expressions of the materials of the second type semiconductor layer 130 in the three embodiments are respectively $Al_{0.3}Ga_{0.2}In_{0.5}P$, $Al_{0.3}Ga_{0.1}In_{0.6}P$ and $Al_{0.5}In_{0.5}P$ (when y=0).

Referring to FIG. 2A, FIG. 2B and FIG. 3 again, it is additionally explained that in the X-ray diffractometer analysis spectrum, the smaller the molecular lattice constant of the film layer is, the greater the corresponding diffractive angle Omega-2θ is. Since aluminum, gallium, and indium are elements of the same period, their molecular lattice constants also increase along with the increase of atomic number, so that when the lattice mismatch layer 140 contains different compound compositions, as the content of aluminum and gallium with smaller atomic numbers increases, for example, when a sum the contents thereof is greater than the content of indium (i.e., i+j>k), it means that the position corresponding to the diffractive angle Omega-2θ of the lattice mismatch layer 140 in the X-ray diffractometer analysis spectrum moves to the right. Therefore, the content of indium in the lattice mismatch layer 140 is less than the content of indium in the second type semiconductor layer 130 (i.e., the P-type semiconductor layer) (i.e., k<z), which means that the lattice constant of the lattice mismatch layer 140 is smaller, and the position of the diffractive angle Omega-2θ thereof will be on the right of the position of the diffractive angle Omega-2θ of the second type semiconductor layer 130. In another embodiment not shown, the secondary diffractive peak P2 may also be on the left side of the main diffractive peak P1, for example, the diffractive angle of the main diffractive peak P1 is between the diffractive angles of the secondary diffractive peak P2 and the reference diffractive peak P0, and in the embodiment, a proportion of indium atoms in the lattice mismatch layer 140 is greater than a proportion of indium atoms in at least one of the first type semiconductor 110 and the second type semiconductor 130, and the proportion of indium atoms in the lattice mismatch layer 140 is also greater than the proportion of indium atoms in at least one of the first type semiconductor 110, the active layer 120 and the second type semiconductor 130.

Figure 5A:
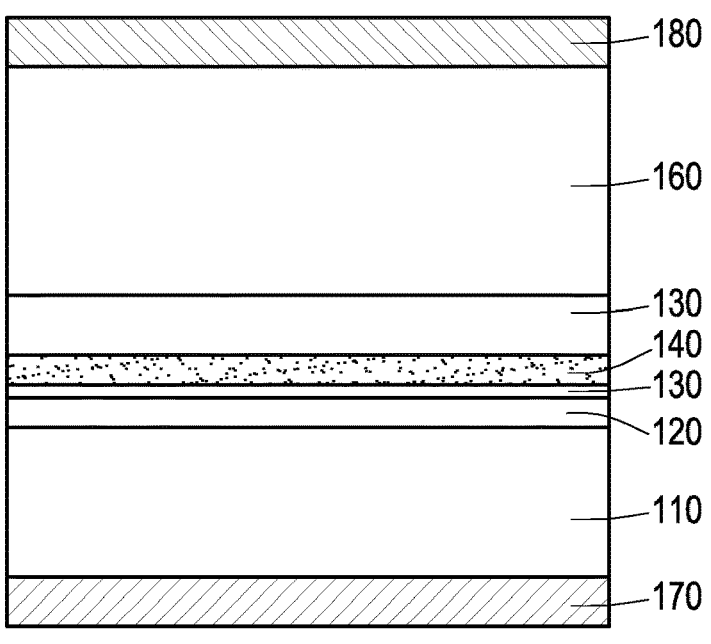
FIG. 5A is a schematic cross-sectional view of an epitaxial structure according to still another embodiment of the invention.

FIG. 5A is a schematic cross-sectional view of an epitaxial structure according to still another embodiment of the invention. Referring to FIG. 5A, an epitaxial structure 100*b* of the embodiment is similar to the epitaxial structure 100 of FIG. 1, and differences there between are as follows. In the epitaxial structure 100*b* of the embodiment, the lattice mismatch layer 140 is located in the second type semiconductor layer 130. In addition, in the embodiment, the first electrode 170 and the second electrode 180 are respectively located on the first type semiconductor layer 110 and the window layer 160, and the first electrode 170 or the second electrode 180 may be a transparent electrode, and a material thereof is, for example, indium tin oxide.

Figure 5B:
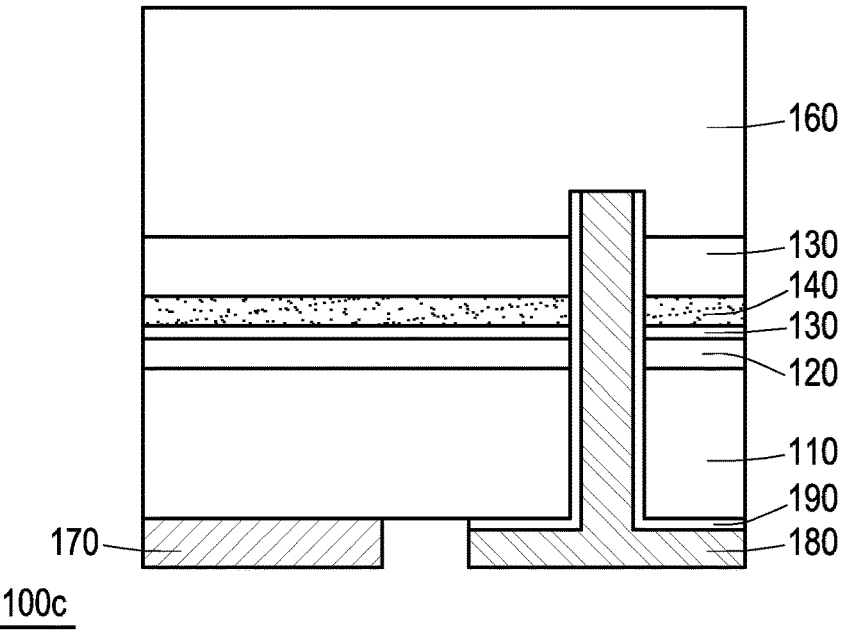
FIG. 5B is a schematic cross-sectional view of an epitaxial structure according to yet another embodiment of the invention.
Figure 6A:
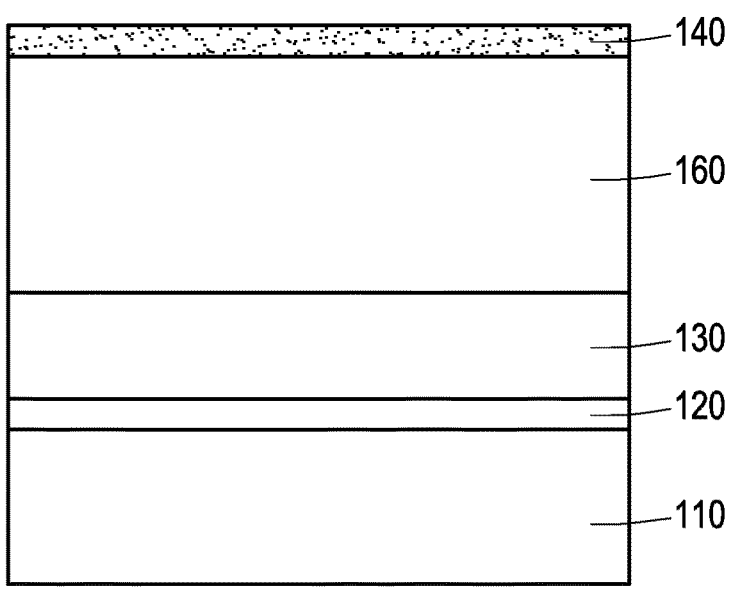
FIG. 6A to FIG. 6D, FIG. 7A to FIG. 7C, and FIG. 8A to FIG. 8C are schematic cross-sectional views of epitaxial structures according to other embodiments of the invention, which show various possible positions and changes of a lattice mismatch layer.
Figure 6B:
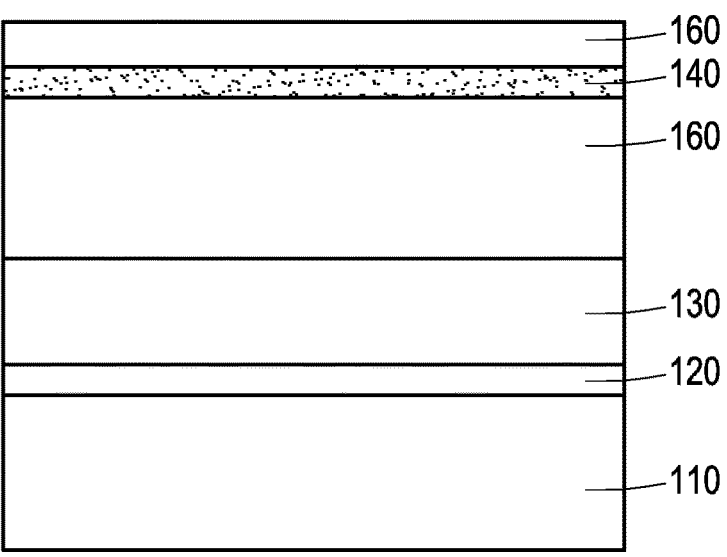
Figure 6C:
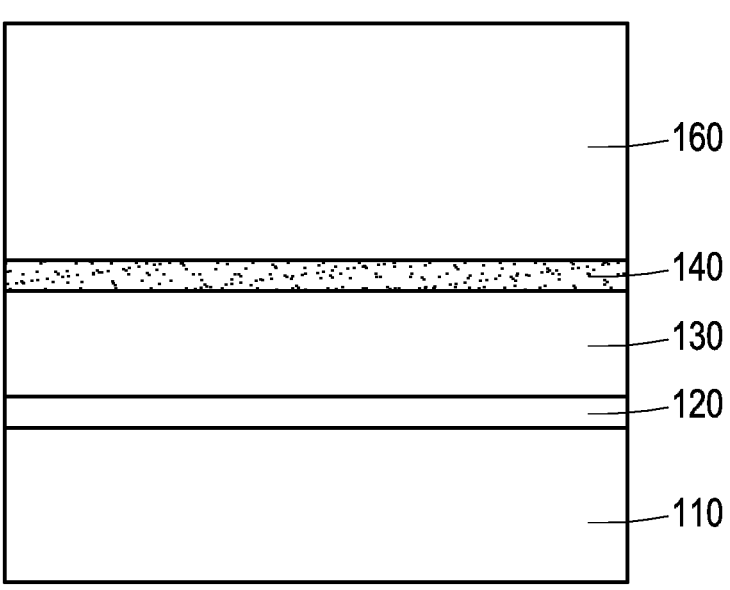
Figure 6D:
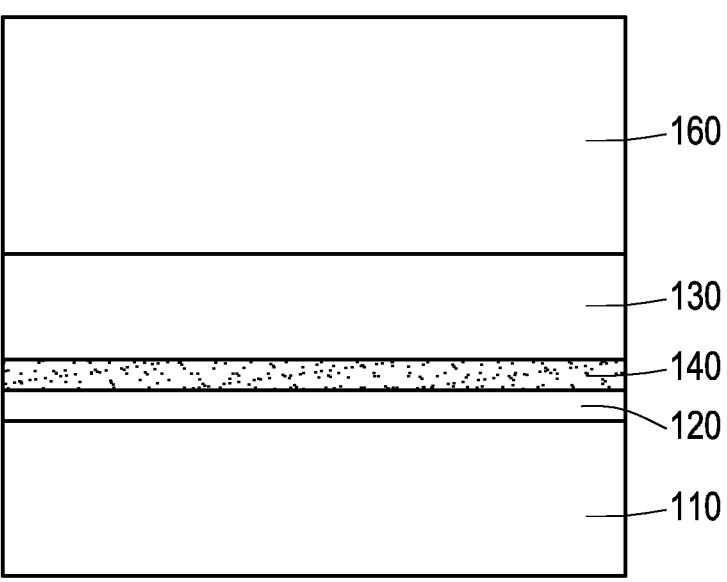

FIG. 5B is a schematic cross-sectional view of an epitaxial structure according to yet another embodiment of the invention. Referring to FIG. 5B, an epitaxial structure 100*c* of the embodiment is similar to the epitaxial structure 100 of FIG. 1, and differences there between are as follows. In the epitaxial structure 100*c* of the embodiment, the lattice mismatch layer 140 is located in the second type semiconductor layer 130, and the second electrode 180 is disposed on the first type semiconductor layer 110 through the insulating layer 190, and is electrically connected to the window layer 160 through the conductive via, and the window layer 160 is electrically connected to the second semiconductor layer 130.

FIG. 6A to FIG. 6D, FIG. 7A to FIG. 7C, and FIG. 8A to FIG. 8C are schematic cross-sectional views of epitaxial structures according to other embodiments of the invention, which show various possible positions and changes of a lattice mismatch layer 140. FIG. 6A to FIG. 6D are embodiments of the lattice mismatch layer 140 on the side of the second type semiconductor layer 130. In an epitaxial structure 100*d* of FIG. 6A, the lattice mismatch layer 140 is disposed on a side of the window layer 160 away from the second type semiconductor layer 130. In an epitaxial structure 100*e* of FIG. 6B, the lattice mismatch layer 140 is disposed in the window layer 160. In an epitaxial structure 100*f* of FIG. 6C, the lattice mismatch layer 140 is disposed between the second type semiconductor layer 130 and the window layer 160. In an epitaxial structure 100*h* of FIG. 6D, the lattice mismatch layer 140 is disposed between the active layer 120 and the second type semiconductor layer 130.

Figure 7A:
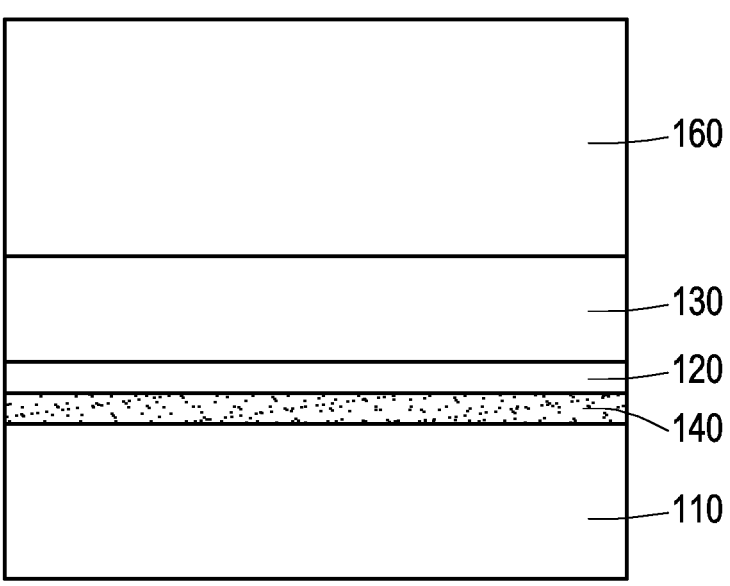
Figure 7B:
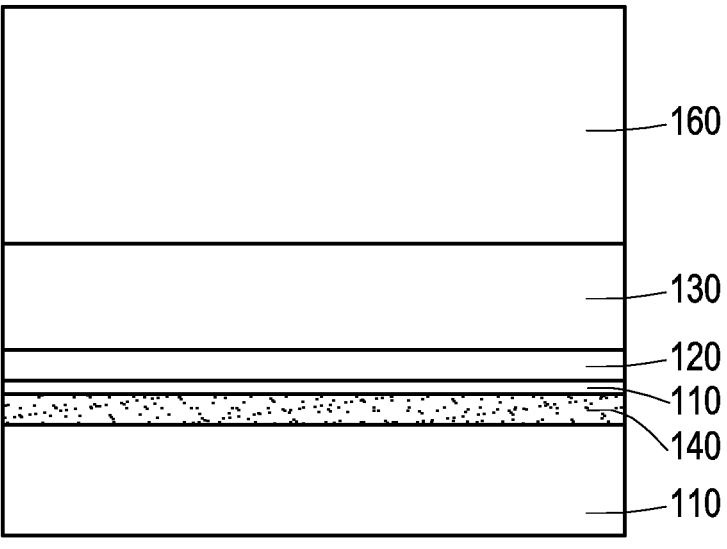
Figure 7C:
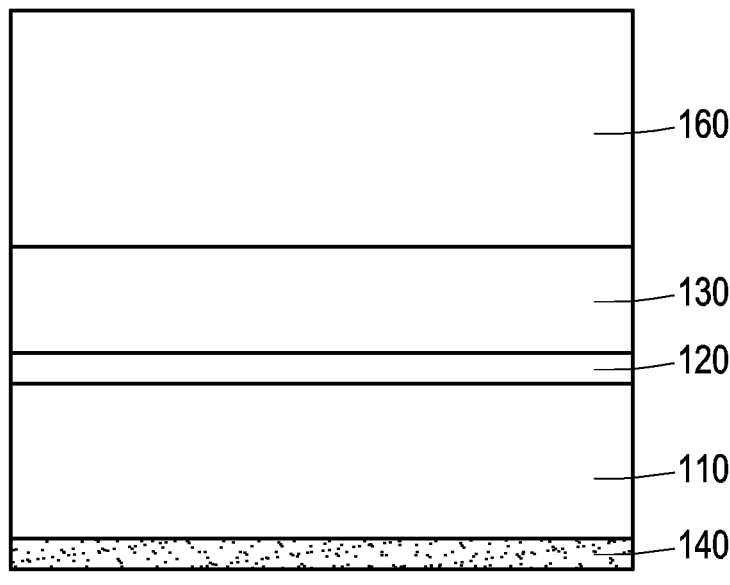

FIG. 7A to FIG. 7C are embodiments of the lattice mismatch layer 140 on the side of the first type semiconductor layer 110. In an epitaxial structure 100*i* of FIG. 7A, the lattice mismatch layer 140 is disposed between the active layer 120 and the first type semiconductor layer 110. In an epitaxial structure 100*j* of FIG. 7B, the lattice mismatch layer 140 is disposed in the first type semiconductor layer 110. In an epitaxial structure 100*k* of FIG. 7C, the lattice mismatch layer 140 is disposed on a side of the first type semiconductor layer 110 away from the active layer 120.

Figure 8A:
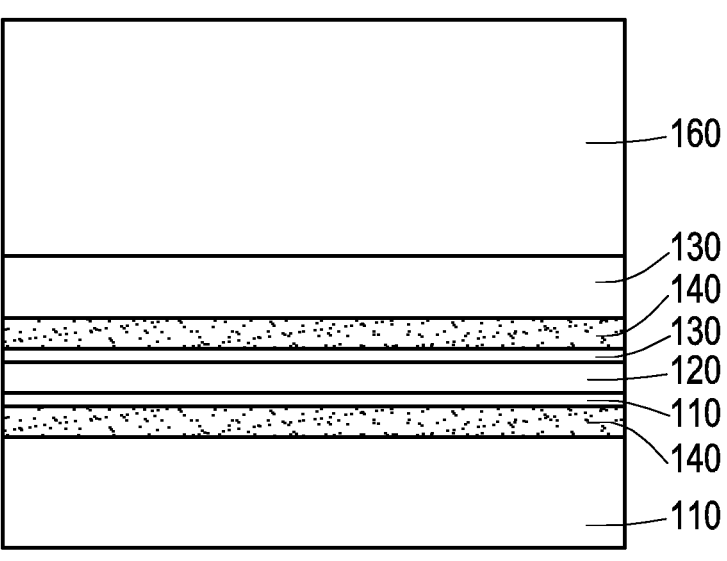
Figure 8B:
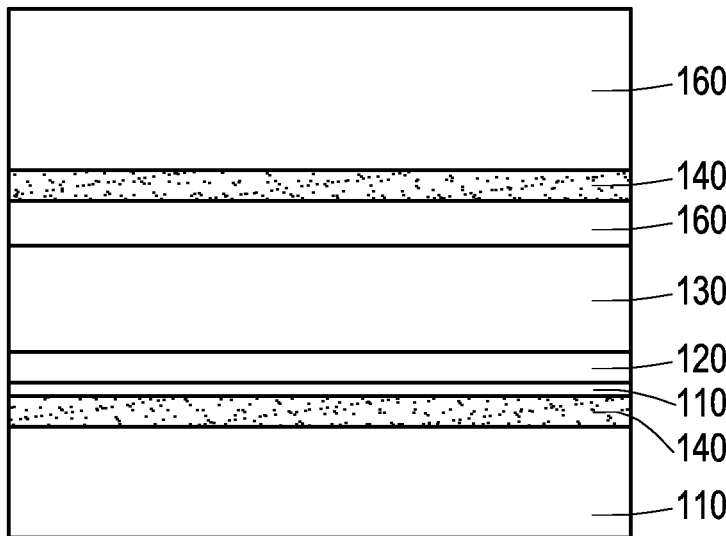
Figure 8C:
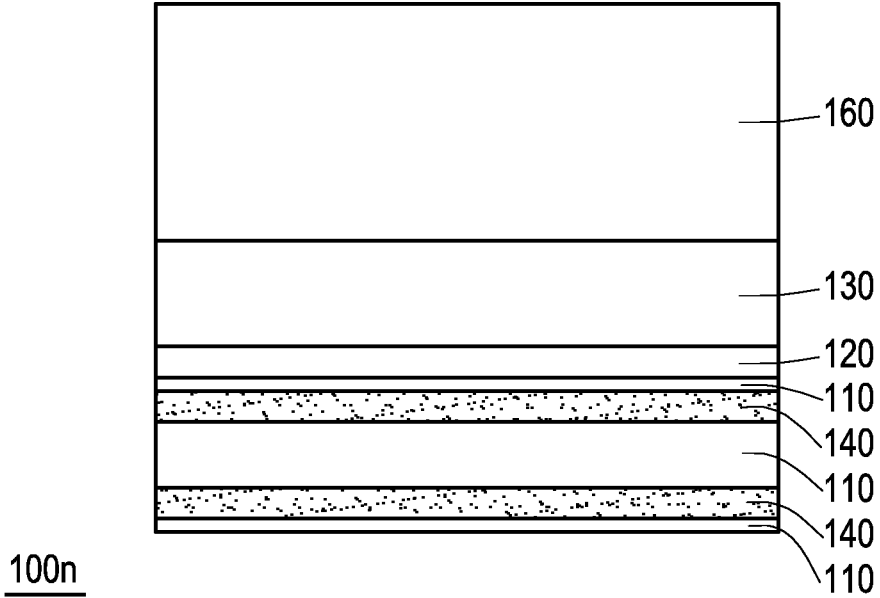

FIG. 8A to FIG. 8C are embodiments of epitaxial structures having multiple lattice mismatch layers 140. In an epitaxial structure 100*l* of FIG. 8A, one lattice mismatch layer 140 is located in the first type semiconductor layer 110, and the other lattice mismatch layer 140 is located in the second type semiconductor layer 130. In an epitaxial structure 100*m* of FIG. 8B, one lattice mismatch layer 140 is located in the first type semiconductor layer 110, and the other lattice mismatch layer 140 is located in the window layer 160. However, in other embodiments, one lattice mismatch layer 140 may be located at any position in FIG. 7A to FIG. 7C, and the other lattice mismatch layer 140 may be located at any position in FIG. 6A to FIG. 6D. In an epitaxial structure 100*n* of FIG. 8C, both of the lattice mismatch layers 140 are located in the first type semiconductor layer 110. However, in other embodiments, the two lattice mismatch layers 140 may also be located at any two positions in FIG. 7A to FIG. 7C, or at any two positions in FIG. 6A to FIG. 6D (i.e., the two lattice mismatch layers 140 are all on the side of the second type semiconductor layer 130). In other embodiments, there may be three or more lattice mismatch layers 140, and the lattice mismatch layers 140 may be disposed at any three positions in FIG. 6A to FIG. 6D and FIG. 7A to FIG. 7C.

In summary, in the epitaxial structure of the embodiment of the invention, the lattice mismatch layer is added, and a lattice arrangement thereof is relatively disordered compared with the adjacent semiconductor layer, and the lattice does not match the adjacent semiconductor layer. Through the disorder or mismatch of lattice arrangement, a current distribution path may be changed, which may increase the ability to resist electrostatic discharge breakdown. Therefore, the epitaxial structure of the embodiment of the invention has good electrostatic discharge protection capability.

What is claimed is:

1. An epitaxial structure, comprising:
a first type semiconductor layer comprising a material of aluminum gallium indium phosphide;
an active layer disposed on a side of the first type semiconductor layer;
a second type semiconductor layer disposed on a side of the active layer away from the first type semiconductor layer and comprising the material of aluminum gallium indium phosphide; and
a lattice mismatch layer comprising the material of aluminum gallium indium phosphide and disposed on any side of the first type semiconductor layer, the active layer, or the second type semiconductor layer,
wherein in an X-ray diffractometer analysis spectrum, at least one of the first type semiconductor layer, the active layer, and the second type semiconductor layer corresponds to a main diffractive peak, the lattice mismatch layer has a secondary diffractive peak, and a difference between diffractive angles of the secondary diffractive peak and the main diffractive peak falls within a range of 400 arc-seconds to 900 arc-seconds.

2. The epitaxial structure according to claim 1, further comprising a growth substrate, wherein the first type semiconductor layer is disposed on the growth substrate, the growth substrate corresponds to a reference diffractive peak in the X-ray diffractometer analysis spectrum, and a diffractive angle of the reference diffractive peak is between the diffractive angles of the main diffractive peak and the secondary diffractive peak.

3. The epitaxial structure according to claim 2, wherein a lattice constant of the lattice mismatch layer is less than a lattice constant of the growth substrate.

4. The epitaxial structure according to claim 2, wherein a difference between the diffractive angles of the secondary diffractive peak and the reference diffractive peak falls within a range of 200 arc-seconds to 700 arc-seconds.

5. The epitaxial structure according to claim 4, wherein the diffractive angle of the secondary diffractive peak is greater than the diffractive angle of the reference diffractive peak.

6. The epitaxial structure according to claim 5, wherein the difference between the diffractive angles of the secondary diffractive peak and the reference diffractive peak falls within a range of 450 arc-seconds to 500 arc-seconds.

7. The epitaxial structure according to claim 2, wherein a proportion of indium atoms in the lattice mismatch layer is less than a sum of proportions of aluminum and gallium atoms, and the proportion of indium atoms in the lattice mismatch layer is also less than a proportion of indium atoms in at least one of the first type semiconductor, the active layer, and the second type semiconductor.

8. The epitaxial structure according to claim 1, further comprising a growth substrate, wherein the first type semiconductor layer is disposed on the growth substrate, the growth substrate corresponds to a reference diffractive peak in the X-ray diffractometer analysis spectrum, and the diffractive angle of the main diffractive peak is between the diffractive angles of the secondary diffractive peak and the reference diffractive peak.

9. The epitaxial structure according to claim 8, wherein a proportion of indium atoms in the lattice mismatch layer is greater than a sum of proportions of aluminum and gallium atoms, and the proportion of indium atoms in the lattice mismatch layer is also greater than a proportion of indium atoms in at least one of the first type semiconductor, the active layer, and the second type semiconductor.

10. The epitaxial structure according to claim 1, wherein a full width at half maximum of the secondary diffractive peak falls within a range of 150 arc-seconds to 400 arc-seconds.

11. The epitaxial structure according to claim 1, wherein a diffractive intensity of the secondary diffractive peak falls within a range of 5% to 20% of a diffractive intensity value of the main diffractive peak.

12. The epitaxial structure according to claim 1, wherein a thickness of the first type semiconductor layer is greater than a thickness of the second type semiconductor layer, and the epitaxial structure further comprises a window layer disposed on a side of the second type semiconductor layer away from the first type semiconductor layer, wherein the lattice mismatch layer is disposed between the window layer and the second type semiconductor layer or inside one of the window layer and the second type semiconductor layer, or between the second type semiconductor layer and the active layer.

13. The epitaxial structure according to claim 2, wherein a ratio of a difference between diffractive angles of the secondary diffractive peak and a reference diffractive peak to a full width at half maximum of the secondary diffractive peak is between 1 and 2.

* * * * *